United States Patent [19]

Grunwald et al.

[11] Patent Number: 5,290,608
[45] Date of Patent: Mar. 1, 1994

[54] METHOD FOR FORMING A PATTERNED MASK

[75] Inventors: John Grunwald, Ramat Gal, Israel; Gary Larson, Cheshire, Conn.

[73] Assignee: MacDermid, Incorporated, Waterbury, Conn.

[21] Appl. No.: 97,138

[22] Filed: Jul. 26, 1993

[51] Int. Cl.$^5$ .............................................. B05D 3/06
[52] U.S. Cl. ..................................... 427/493; 427/96; 427/273; 427/385.5; 427/386; 427/510; 427/555; 427/557; 427/558
[58] Field of Search ............... 427/493, 510, 555, 557, 427/558, 96, 273, 272.2, 379, 385.5, 386

*Primary Examiner*—Bernard Pianalto
*Attorney, Agent, or Firm*—St. Onge Steward Johnston & Reens

[57] ABSTRACT

A patterned mask is provided on a surface by formulating a liquid, 100% solids-type thermally curable mask composition, applying the composition as a film to the surface, selectively thermally exposing the film in the desired mask pattern using a focused beam of heat energy without use of an interposed patterned mask, and then developing away the film areas not thermally exposed so as to produce a patterned mask. The invention enables the elimination of potentially troublesome volatile solvent carriers or diluents from the composition, while at the same time still enabling production of finely-defined patterns without having to bring a patterned mask (cf. phototool) into contact with the composition. Similarly, the expense involved with use of dry film photo-sensitive masks is avoided.

15 Claims, No Drawings

METHOD FOR FORMING A PATTERNED MASK

BACKGROUND OF THE INVENTION

The present invention relates to the fabrication of printed circuits, and more particularly to solder masks utilized in connection with printed circuit fabrication.

A solder mask comprises a resin coating which is provided on a printed circuit board surface in order to prevent all but selected areas of the board (e.g., metallized through-holes and their surrounding pads; lands for surface mounted electronic components) from coming into contact with solder during operations which are designed to selectively provide solder at those areas (e.g., by tin-lead reflow/fusing or hot air solder levelling) and during operations which are designed to solder-connect electronic components at those areas (e.g., wave soldering). Solder masks also serve as a means for generally protecting surface circuitry against scratches, dirt contamination, corrosion, and the like.

Of necessity, solder masks must be applied to the board surfaces in a predetermined pattern so that holes, pads, lands, etc. are not covered thereby. One means for effecting this patterned application is to provide a liquid resinous composition which can be cured (cross-linked) either by heat or by radiation-induced mechanism. The composition is screen printed onto the board directly in the desired pattern through an appropriately-stenciled screen, and then baked or blanket-exposed to radiation (e.g., UV), as the case may be, in order to cure the patterned composition into a suitable solder mask. An advantage of such solder mask compositions is that they can be formulated as essentially 100% solids compositions, i.e., liquid compositions but without need for a volatile solvent carrier which might pose health concerns in handling of the compositions and during evaporation after application.

A disadvantage of screen-printed solder mask compositions, however, is the difficulty in applying them in the precisely defined patterns dictated by modern day fine line, closely-spaced circuitry. The compositions tend to bleed through the stencil onto board areas where solder mask is not desired, necessitating constant monitoring and touch-up in order to blot away such areas before final cure takes place.

Much improved fine line definition is attainable utilizing photo-sensitive solder mask compositions which are applied in generally unpatterned form (e.g., as a continuous coating) over the circuit board surface, followed by exposure of selected areas of the composition to radiation of suitable wavelength so as to effect radiation-induced curing of the composition at such selected areas. A developer is then employed to remove unexposed composition and produce the desired solder mask pattern.

In known methods for utilizing photo-sensitive solder mask compositions, the imagewise exposure to radiation is accomplished using an appropriately patterned phototool which permits transmission of radiation (e.g., UV light) therethrough, to the composition coating, only in the desired pattern, and for the most precise line definition, the phototool must be arranged in direct contact with the composition. For this reason, 100% solids-type compositions cannot be employed, i.e, it is not possible to place a phototool in direct contact with these wet (liquid) compositions. Rather, the photo-sensitive solder mask composition must be formulated as a solvent-carried resin system which is applied to the board as a liquid coating and then evaporated to substantial dryness so as to enable arrangement of the phototool directly thereon. In turn, then, this necessity brings into play the earlier noted problems and concerns with volatile solvents.

Dry film solder masks avoid, at least for the printed circuit manufacturer, the need to deal with solvent-carried photo-sensitive solder mask compositions. However, dry films are inherently more expensive than liquid photo-sensitive compositions, and require more expensive application techniques and equipment.

SUMMARY OF THE INVENTION

It is a primary object of the present invention to provide a means for producing a mask, especially a solder mask, of appropriate finely defined pattern on a surface, especially a printed circuit board, utilizing a composition which contains essentially no solvent carrier, i.e., a 100% solids-type composition, but which nevertheless can be precisely patterned into a cured mask. For ease of description, the invention will be described in terms of the production of a solder mask on a printed circuit board. However, it will be understood that the invention is equally applicable to the production of any thermally-curable mask applied to a surface.

This, and other objects as will be apparent, are attained through use of a thermally-curable solder mask composition of the 100% solids-type, which is applied to the printed circuit board surface as a film coating and then imaged, without the use of an interposed patterned mask, with a focused beam of heat energy in a pattern corresponding to that of the desired solder mask pattern. The heat energy selectively cures the composition at the so-exposed areas, such that a suitable developer can be used to remove uncured composition not exposed to the heat beam and thereby produce the desired solder mask pattern. If necessary, the so-formed patterned solder mask can then be further heated to effect even more complete cure.

By proceeding in the foregoing manner, it is possible to make use of a 100% solids-type solder mask composition which is neither a dry film nor a composition requiring screen printing. Thermal imaging enables the fine definition required of solder masks for modern day printed circuits. Because this imaging does not require the use of a patterned mask, there is no difficulty in employing a wet solder mask composition (which otherwise would be impossible if a phototool needed to be in direct contact therewith). Accordingly, compositions are utilized which have essentially no carrier solvent, and thus any concerns regarding handling of solvent-carried compositions, or regarding the need for solvent evaporation, are eliminated. Moreover, because the compositions are not of the dry film type, their application to the printed circuit board surface can be effected using cost-effective liquid coating techniques (e.g., roller coating, spin coating, curtain coating) and without need for dry film lamination equipment.

In the process of the invention, then, a printed circuit board having surface circuitry traces, metallized through-holes and their surrounding pads, optional lands, and the like, is provided with a patterned solder mask which masks areas of the printed circuit other than those that will later be involved in solder connections. In the process, a thermally-curable 100% solids-type resinous composition is applied to the board surface as a film; thereafter, in a predetermined pattern and without use of an interposed patterned mask, there is directed to selected areas of the film, corresponding to the positive of the desired solder mask pattern, a focused beam of heat energy effective to thermally induce at such film areas a cure of the composition to at least an extent sufficient to render such areas differentially less soluble in a particular developer than the film areas not exposed to the heat beam; and thereafter the film areas not exposed to the heat beam are removed from the board surface by contact with developer, thereby leaving behind a patterned solder mask. Depending upon the extent of cure effected in the thermal imaging, the patterned solder mask can be thereafter further treated (e.g., heating, blanket or cure) to bring about whatever further extent of curing is desired or necessary so that a proper solder mask is provided.

The solder mask composition employed can be formulated from any suitable thermally-curable resin system which, in its cured state, affords the degree of solder resistance and thermal stability required of a solder mask in printed circuitry applications. The most preferred such systems will be based upon epoxy compounds, and can be initially provided as a one-part system or a multi-part system in which segregated components are mixed just prior to use. At the time of application to the circuit board surface, the thermally-curable solder mask composition will be in a liquid form but is otherwise a 100% solids-type composition, i.e., all components thereof enter into formation of the cured resin and no vehicular solvent or diluent requiring evaporation is included. Optionally, the composition may also contain UV sensitizers for final blanket curing.

The preferred means for focusing the requisite intensity of the thermal energy to the selected composition film areas so as there bring about the appropriate thermally-induced cure of the composition will be by way of an infrared (IR) beam, e.g., a laser beam emitted by a thermal laser such as a laser diode, Neodynium-Yag or $CO_2$ diode laser, although any other heat energy beam which can be focused to the extent required (as dictated by the degree of line definition involved with the particular solder mask pattern) can be employed, such as a beam of solar light. The focused beam supplies a highly localized heat which induces thermal cure of the selected composition areas and, hence, can be likened to a focused moving oven. The scanning of the film with the focused beam in the appropriate pattern can be controlled, e.g., by a CAD device. See, e.g., Emmel, P. M., SPIE Proceedings 2, 222 (1980).

DETAILED DESCRIPTION OF THE INVENTION

The present invention is applicable in any situation in which a printed circuit board surface is required to be solder masked in a particular pattern. As such, the invention is applicable to the solder masking of circuitry surfaces of single- or double-sided printed circuits, as well as to the solder masking of outerlayer circuitry surfaces of multilayer printed circuits.

In a typical embodiment, such as applicable to doublesided printed circuits and outer layer circuitry of multilayer circuits, through-holes will be provided through the dielectric material, and the hole surfaces then metallized to provide a conductive interconnection path for the various conductive layers of the circuit. The board surfaces are then processed to form thereon the desired circuitry pattern, such as consisting of conductive traces, conductive pad areas at the through-hole openings, and conductive land areas for eventual arrangement of surface mounted electronic components.

In fabricating the printed circuit, the areas at which solder connection of electronic components later will be made, i.e., through-holes, pads, lands, will typically be selectively provided with a material which preserves and promotes solderability of such areas, typically solder itself. To this end, it is necessary to effect masking of all other surface areas of the printed circuit before this selective solder provision occurs. In some processes, the solder provision is by reflow and fusing of tin-lead which already has been plated on the circuitry to serve as an etch resist in the fabrication process, and thus solder masking of all areas other than holes, pads, lands will be effected before the reflow/fusing. In more preferred processes, tin-lead is first stripped from all conductive areas so as to reveal bare copper circuitry, followed by solder masking of all areas other than holes, pads, lands, followed by selective provision of the exposed copper surfaces thereof with solder, such as by hot air solder levelling, immersion tin-lead plating, or the like. In still other processes, the fabrication sequence is such that an organic etch resist is used instead of tin-lead, so that stripping of the resist reveals bare copper circuitry which is then selectively solder masked. In yet other processes, the fabrication sequence is one not requiring an etch resist, such that copper circuitry is produced directly and then selectively solder masked.

Various processes of the foregoing types are well known in the art. Reference may be had, for example, to U.S. Pat. No. 4,687,545 to Williams et al; U.S. Pat. Nos. 4,732,649 and 4,806,200 to Larson et al; U.S. Pat. No. 4,804,615 to Larson et al; and U.S. Pat. No. 5,160,579 to Larson et al. The particular methods by which conductive circuitry patterns are produced form no part of the invention per se. All that is important is that at some point in the process it is necessary to selectively solder mask surface areas of the printed circuit board so that these areas are not wetted by solder in subsequent procedures during which solder is provided at other areas and/or during which electronic components are solder connected at those other areas.

The solder mask is produced from an essentially thermally-curable resin composition of the 100% solids-type. This liquid composition is applied to the board surface as a film layer of suitable thickness (e.g., from about 0.9 mil to about 1.1 mil) on the traces by any suitable means, such as roller coating, spin coating, curtain coating, or the like. The film-coated board is then selectively thermally exposed to a suitably focused beam of heat energy, without use of an interposed patterned mask, in a thermal exposure pattern which corresponds to the positive of the desired solder mask pattern (e.g., such that the beam is directed to all areas other than those at which the film overlies through-holes, pads surrounding through-hole entrances, lands). The heat energy selectively directed to the film areas in question there brings about selective thermal curing of the composition to a degree at least sufficient to cause the composition there to become differentially less soluble in a suitable developer than the composition areas which were not exposed to the heat energy beam. As such, it is not strictly necessary that the directed heat energy bring about complete, stable cure of the resin composition, so long as the degree of cure produces differential insolubility. Additional cure of the solder mask can take place by non-specific heating (post-baking) after the solder mask pattern has been produced (i.e., after development) or by blanket UV exposure when the composition has been formulated to contain an appropriate UV sensitizer. After the patterned heat exposure, the film is contacted with a suitable developer, with effect of selectively removing from the board the composition areas not selectively heat exposed, and thus revealing the underlying metal surfaces of holes, pads, lands. Thereafter, the board is processed in the usual way to arrange a solderability-promoting-/solderability-preserving metallic coating on the exposed metal surfaces, and/or to connect the leads or surfaces of electronic components thereto, such as by wave soldering.

The solder mask composition may comprise any thermally-curable resin system which can be cured at time and temperature conditions compatible with printed circuit fabrication processes and which, in its eventually cured condition, exhibits the properties required of a solder mask, such as adhesion to the board surfaces, resistance to solder wetting and thermal stability. The resin system will be in liquid form in the range of temperatures at which it will be employed for application to the printed circuit board surface as a film, and will be of the 100% solids-type as earlier noted, such that essentially no volatile carrier solvents or non-reactive diluents are present.

The resin systems employed typically will be those which make use of a cross-linking agent which cures a resin component(s) under suitable temperature conditions in a suitable environment. In such systems it is generally good practice to guard against any premature cross-linking which might occur under formulation, transportation or storage conditions, and thus the cross-linking agent typically will be separately packaged from the reactive resin components, with admixture in the required ratio occurring just prior to use of the composition. Suitable 100% solids-type compositions can be formulated, for example, from a system comprising an epoxy resin or epoxy novolac resin and an aromatic amine as a cross-linking agent. Additional cross linking agents include imidazoles, phenol, phenolics, anhydrides and the like. Suitable cure of such systems is usually effected at temperatures in the range of about 275°-300° F. for about 1 hour for total cure. As previously noted, the composition also can be formulated in a manner so as to enable a final cure (i.e., after thermal imaging and development) through blanket UV exposure.

As previously noted, the preferred focused source of heat energy will be a thermal laser capable of producing a beam of thermal energy, such as a laser diode, carbon dioxide laser, or Neodynium-Yag laser. The output of the $CO_2$ laser lies in the infrared and the highest gain transition is at 10.6 $\mu$m. The Neodynium-Yag lasers are capable of operation at high average power levels, at a wavelength of 1.06 $\mu$m. Laser diodes typically operate near 0.8 $\mu$m.

The focused heat source is scanned across the solder mask film composition in the pattern corresponding to that of the desired solder mask according to a pre-programmed scanning pattern dictated by a computer-aided design (CAD), much in the same general way that direct imaging processes have been proposed and developed for selective exposure of specially formulated photoresists using UV lasers. See, e.g., U.S. Pat. No. 4,724,465; Kuchta, A. D., "Technological Requirements For Direct Imaging Of Photoresists", Technical Paper No. A 8/1, Printed Circuit World Convention 5 (June 1990); Meier, K., "Laser Direct Imaging In High Definition Image Transfer Processes", Technical Paper No. A 8/2, Printed Circuit World Convention 5 (June 1990).

The invention is further illustrated with reference to the following examples.

EXAMPLE I

A 100% solids-type mask composition was formulated as follows:

|  | % By Weight |
| --- | --- |
| Component 1 | |
| Novolac epoxy (DEN 438, available from Dow Chemical) | 40 |
| Pigment (Phthalo Green, available from ICI Chemicals) | 1 |
| Cycloaliphatic epoxy (ERL-4221, available from Union Carbide) | 29 |
| Filler (Aerosil, available from Degussa) | 30 |
| Component 2 | |
| Aromatic Amine (Ancamine SRX, available from Pacific Anchor) | 100 |

Component 1 and Component 2 were mixed in the ratio of 15 parts Component 2 to each 100 parts of Component 1, and the resultant composition then blanket coated, to a film thickness of 1.0 on the traces etc., onto the surface of a printed circuit having patterned copper circuitry consisting of trace areas, metallized through-holes, pads surrounding the through-hole entrances and conductive land areas. The film was then scanned in a predetermined CAD-directed pattern, without an interposed patterned mask layer, with a Neodynium-Yag laser emitting light at 1.06 $\mu$m such that all film areas other than those overlying the holes, pads and lands were contacted with the thermal beam. The pattern-exposed film was then developed with butyl cellosolve to remove the unexposed film areas and reveal the holes, pads and lands. The printed circuit board was then processed by hot air solder levelling to provide a solder coating over the copper surfaces of the holes, pads and lands. During this operation, the solder mask pattern remained firmly adhered to the board surfaces and resisted any solder wetting.

EXAMPLE II

A 100% solids-type solder mask composition was formulated as follows:

|  | % By Weight |
| --- | --- |
| Component 1 | |
| Novolac epoxy (Quatrex 2410, available from Dow Corning) | 40 |
| Pigment (Phthalo Green, available from ICI Chemical) | 1 |
| Cycloaliphatic epoxy (ERL-4234, available from Union Carbide) | 30 |
| Filler (Aerosil, available from Degussa) | 29 |
| Component 2 | |
| Aromatic Amine (Ancamine SRX, available from Pacific Anchor) | 100 |

Component 1 and Component 2 were mixed in the ratio of 15 parts Component 2 to each 100 parts of Component 1, and the resultant composition then blanket coated, to a film thickness of 1.0 on the traces etc., onto the surface of a printed circuit having patterned copper circuitry consisting of trace areas, metallized through-holes, pads surrounding the through-hole entrances and conductive land areas. The film was then scanned in a predetermined CAD-directed pattern, without an interposed patterned mask layer, with a Neodynium-Yag laser emitting light at 1.06 μm such that all film areas other than those overlying the holes, pads and lands were contacted with the thermal beam. The pattern-exposed film was then developed with butyl cellosolve to remove the unexposed film areas and reveal the holes, pads and lands. The printed circuit board was then processed by hot air solder levelling to provide a solder coating over the copper surfaces of the holes, pads and lands. During this operation, the solder mask pattern remained firmly adhered to the board surfaces and resisted any solder wetting.

Although the invention has been described in detail with reference to particular preferred embodiments and examples, it will be understood that such description is presented in illustration rather than limitation of the invention, the scope of which is defined in the appended claims.

What is claimed is:

1. A method for forming a patterned mask on a surface, comprising:
   (a) providing a thermally-curable mask composition in the form of a liquid 100% solids composition;
   (b) applying said composition as a film to said surface;
   (c) thereafter, in a predetermined pattern and without use of an interposed patterned mask, directing to selected areas of said film, corresponding to the positive image of the desired mask pattern, a focused beam of heat energy effective to there bring about thermal cure of said composition to an extent sufficient to render such areas differentially less soluble in a developer than film areas to which said focused beam was not directed; and
   (d) thereafter contacting said film with a developer effective to remove from the surface those film areas to which said focused beam was not directed.

2. The method of claim 1 wherein said mask comprises a solder mask and said surface is a surface of a printed circuit board.

3. The method of claim 2 wherein said solder mask composition comprises a thermally-curable resin system which, in its cured state, affords the degree of solder resistance and thermal stability required of a solder mask in printed circuitry applications.

4. The method of claim 3 wherein said solder mask composition comprises at least one epoxy compound.

5. The method of claim 4 wherein said solder mask composition further comprises a cross-linking agent.

6. The method of claim 5 wherein said cross-linking agent comprises an aromatic amine.

7. The method of claim 2 wherein said solder mask composition is applied to said printed circuit board surface as a film layer having a thickness of about 0.9 mil to about 1.1 mil on the traces.

8. The method of claim 2 wherein said focused beam of heat energy comprises an infrared beam.

9. The method of claim 8 wherein said infrared beam comprises a laser beam emitted by a thermal laser.

10. The method of claim 9 wherein said thermal laser is scanned across said solder mask composition according to a pre-programmed scanning pattern.

11. The method of claim 10 wherein said pre-programmed scanning pattern is dictated by a computer-aided design.

12. The method of claim 1 wherein said mask composition, after exposure to said focused beam of heat energy, is further treated by non-specific heating to effect further curing.

13. The method of claim 12 wherein said composition further comprises components effective to bring about further cure.

14. The method of claim 12 wherein said further treatment is by blanket UV exposure.

15. The method of claim 14 wherein said composition further comprises at least one UV sensitizer to facilitate said further treatment.

* * * * *